United States Patent
Thakur et al.

(10) Patent No.: US 7,229,890 B2
(45) Date of Patent: *Jun. 12, 2007

(54) FORMING INTEGRATED CIRCUITS USING SELECTIVE DEPOSITION OF UNDOPED SILICON FILM SEEDED IN CHLORINE AND HYDRIDE GAS

(75) Inventors: Randhir P. S. Thakur, Boise, ID (US); James Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 425 days.

This patent is subject to a terminal disclaimer.

(21) Appl. No.: 10/368,069

(22) Filed: Feb. 18, 2003

(65) Prior Publication Data

US 2003/0153142 A1    Aug. 14, 2003

Related U.S. Application Data

(60) Division of application No. 09/653,086, filed on Aug. 31, 2000, now Pat. No. 6,521,507, which is a continuation of application No. 08/914,975, filed on Aug. 20, 1997, now Pat. No. 6,146,967.

(51) Int. Cl.
*H01L 21/20* (2006.01)
(52) U.S. Cl. ..................... 438/398; 438/255
(58) Field of Classification Search ............. 438/255, 438/398, 964, 933, 396, 397
See application file for complete search history.

(56) References Cited

U.S. PATENT DOCUMENTS

| | | | |
|---|---|---|---|
| 4,579,609 A | 4/1986 | Reif et al. | 148/175 |
| 5,130,885 A | 7/1992 | Fazan et al. | 361/313 |
| 5,340,765 A | 8/1994 | Dennison et al. | 437/52 |

(Continued)

FOREIGN PATENT DOCUMENTS

JP    61-005068    1/1986

OTHER PUBLICATIONS

Bradbury, D..R. ,et al. ,"Control of Lateral Epitaxial Chemical Vapor Deposition of Silicon over Insulators", *Journal of Applied Physics 55 (2)*, (Jan. 15, 1984),519-523.

Wolf, S..,et al. ,"Silicon Processing for the VLSI Era", vol. 1 *Process Technology, Lattice Press, Sunset Beach, CA*, (1986), 156-156, 178, 222.

Wolf, Stanley.,et al. , "Silicon Processing for the VLSI Era", vol. 1: *Process Technology, Lattice Press, Sunset Beach; CA*, (1986),520, 559-561.

*Primary Examiner*—Thanh Nguyen
(74) *Attorney, Agent, or Firm*—Schwegman, Lundberg, Woessner & Kluth, P.A.

(57) ABSTRACT

A polysilicon film is formed with enhanced selectivity by flowing chlorine during the formation of the film. The chlorine acts as an etchant to insulative areas adjacent polysilicon structures on which the film is desired to be formed. Bottom electrodes for capacitors are formed using this process, followed by an anneal to create hemishperical grain (HSG) polysilicon. Multilayer capacitor containers are formed in a non-oxidizing ambient so that no oxide is formed between the layers. The structure formed is planarized to form separate containers made from doped and undoped amorphous silicon layers. Selected ones of undoped layers are seeded in a chlorine containing environment and annealed to form HSG. A dielectric layer and second electrode are formed to complete the cell capacitor.

28 Claims, 3 Drawing Sheets

U.S. PATENT DOCUMENTS

| | | | |
|---|---|---|---|
| 5,405,801 A | 4/1995 | Han et al. | 437/60 |
| 5,407,534 A | 4/1995 | Thakur | 156/662 |
| 5,411,912 A | 5/1995 | Sakamoto | 437/60 |
| 5,418,180 A * | 5/1995 | Brown | 438/398 |
| 5,444,013 A | 8/1995 | Akram et al. | 437/60 |
| 5,573,968 A | 11/1996 | Park | 437/52 |
| 5,634,974 A * | 6/1997 | Weimer et al. | 117/103 |
| 5,658,381 A | 8/1997 | Thakur et al. | 257/309 |
| 5,759,262 A | 6/1998 | Weimer et al. | 117/88 |
| 5,770,500 A * | 6/1998 | Batra et al. | 438/255 |
| 5,830,793 A | 11/1998 | Schuegraf et al. | 438/255 |
| 5,882,979 A | 3/1999 | Ping et al. | 438/398 |
| 6,146,967 A * | 11/2000 | Thakur et al. | 438/398 |
| 6,255,159 B1 * | 7/2001 | Thakur | 438/398 |
| 6,521,507 B1 * | 2/2003 | Thakur et al. | 438/398 |

* cited by examiner

FORMING INTEGRATED CIRCUITS USING SELECTIVE DEPOSITION OF UNDOPED SILICON FILM SEEDED IN CHLORINE AND HYDRIDE GAS

RELATED APPLICATIONS

This application is a Divisional of U.S. application Ser. No. 09/653,086 filed on Aug. 31, 2000, now issued as U.S. Pat. No. 6,521,507, which is a Continuation of U.S. Ser. No. 08/914,975, filed on Aug. 20, 1997, now issued as U.S. Pat. No. 6,146,967 on Nov. 14, 2000. These applications are incorporated herein by reference.

FIELD OF THE INVENTION

The present invention relates to semiconductor field effect transistors, and in particular to selective depostion on polysilicon surfaces.

BACKGROUND OF THE INVENTION

Dynamic random access memories (DRAMs) are a widely used form of semiconductor memory. DRAMs are composed of a memory cell array and peripheral circuitry. Each memory cell array is formed of a plurality of memory cells for storing information. Typical memory cells are formed with a transistor for accessing a capacitor that stores charge. Of primary concern is maximizing the storage capacitance of each memory cell capacitor. This need is particularly acute in light of the demand for high density DRAMs, without increasing the chip area required to form the cell and, preferably, allowing a decrease in the chip area per cell.

One way to achieve greater capacitance per cell is to increase the surface area of the capacitor electrodes without increasing the respective cell area. As can be seen from the following equation, capacitance, C, is roughly determined by the thickness of the capacitor insulator ($t_{ox}$), the surface area of the capacitor electrodes (A), and the dielectric constant of the capacitor insulator ($\in$).

$$C=(\in \cdot A)/t_{ox}$$

Increasing the surface area of the capacitor electrodes by forming the storage capacitor in a container like shape is well known in the art. To further increase circuit density in DRAMs stacked capacitors are used. These capacitors are actually stacked on top of the substrate, which may or may not include access devices. Two or more layers of a conductive material called electrodes formed of polysilicon or poly are deposited over the substrate with dielectric layers sandwiched between each electrode.

U.S. Pat. No. 5,340,765 to Dennison et al., herein incorporated by reference, describes a method for further increasing the surface area of a bottom electrode of such capacitors by forming the electrode surfaces with hemispherical grained polysilicon (HSG). First, a portion of an oxide layer covering access circuitry on a semiconductor wafer is removed to form a container. A bottom electrode is then formed by growing an amorphous silicon layer. The amorphous silicon layer is then seeded by flowing silane or disilane at elevated temperatures.

After seeding, the wafer is annealed to form HSG on both sides of the doped silicon layer. Formation of a dielectric layer and top capacitor plate complete the capacitor formation.

While the above method creates a roughened surface on the capacitor electrode plate to increase capacitance per unit area, it can lead to undesired deposits forming on oxide, BPSG or other insulator between structures where silicon is desired to be deposited. Such conductive deposits are referred to as stringers which are caused by residual poly film deposited on oxide surfaces that short nearby storage cells or other structures where it is desired to form the poly film. Further steps, such as etches are then required to eliminate such shorting.

There is a need to form poly films in a selective manner. There is a need to form selective poly films in a manner which reduces the need for further processing steps to remove undesired residual poly films. There is yet a further need to form selective poly films without forming shorts between structures on which the film is desired. There is a further need to form such poly films only where formation of HSG is desired. With the rapid decrease in device size, coupled with the demand for increased performance, a new, efficient technique must be found to provide an increase in the capacitance per unit area in DRAM memory cells without causing shorts between cells.

SUMMARY OF THE INVENTION

A chlorine containing gas mixture is flowed during seeding of polysilicon layers to enhance formation of films in a selective manner. The chlorine containing gas enhances selectivity of film formation such that film forms on the polysilicon layers while formation of the film on adjacent insulative layers is inhibited.

In one embodiment of the invention, polysilicon layers of a capacitive storage cell are seeded with hydride gases such as silane, disilane or trisilane while a chlorine containing gas, such as HCl is introduced. The seeding is performed at a temperature of approximately 500 to 800 degrees Celsius. Pressures of up to near atmosphere may be used while still maintaining high selectivity. The seeding is followed by an anneal at a temperature of approximately 500 to 800 degrees Celsius. No retooling from prior HSG formation processes is required, and the higher selectivity provides the ability to modify other process parameters to achieve other goals while still maintaining adequate selectivity.

In a further embodiment, polysilicon structures supported by a substrate are separated by adjacent insulative layers such as oxides or BPSG. The structures are selectively seeded by silane or disilane in the presence of a chlorine containing gas to selectively form a polysilicon film. The use of the chlorine containing gas greatly inhibits the formation of the film between the structures, greatly reducing the chance of a short between the structures.

In yet a further embodiment, a DRAM device comprises multiple stacked capacitive cells having bottom electrodes with selectively seeded HSG. The use of chlorine during seeding of the bottom electrodes provides an increase in the capacitance per unit area in the DRAM memory cells without causing shorts between cells.

In a further variation, polysilicon structures supported by a substrate are separated by adjacent insulative layers such as oxides or BPSG, and the structures are selectively seeded in the presence of an etchant which selectively etches the insulative layers. This inhibits the formation of polysilicon nucleation sites on the insulative layers, resulting in greatly reduced formation of shorts between the structures.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims. Numbering in the Figures is usually done with the hundreds and thousands digits corresponding to the figure number, with the exception that the same components may appear in multiple figures. Scaling in the Figures does not represent precise dimensions of the structures illustrated.

Wafer and substrate are used interchangeably to refer to supporting semiconductor structures during processing. Both are to be understood as including silicon-on-sapphire (SOS) technology, silicon-on-insulator (SOI) technology, doped and undoped semiconductors, epitaxial layers of a silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined by the appended claims.

Figure 1A:
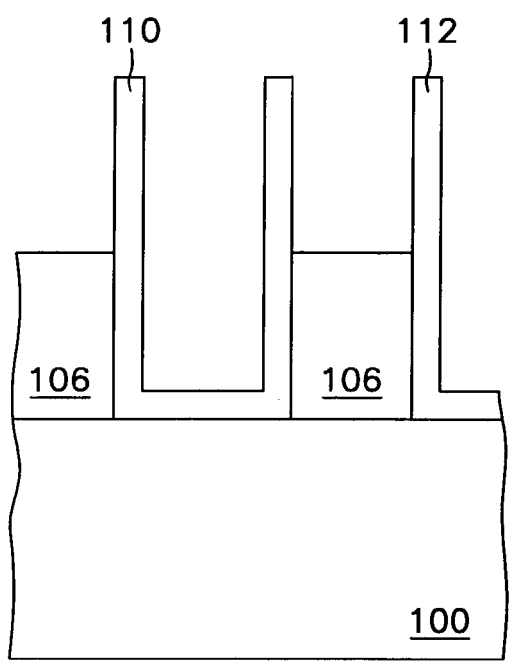
FIGS. 1A, 1B, and 1C are cross section views of a polysilicon structure supported by a substrate on which a selective film is formed.

In FIG. 1A, an amorphous silicon "U" shaped structure referred to as container 110 is formed on a substrate 100 in a well known manner. It is formed in an etched area of an insulative layer 106, which has been etched back to expose exterior sidewalls of container 110. A second container, partially shown at 112 is separated from the first container 110 by insulator 106. Insulator 106 is an oxide or BPSG, or other insulator which inhibits electrical conduction between containers 110 and 112.

Figure 1B:
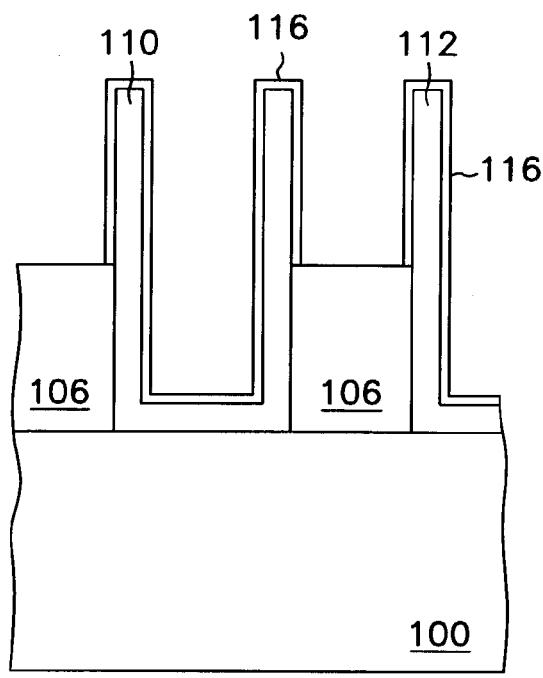
Figure 1C:
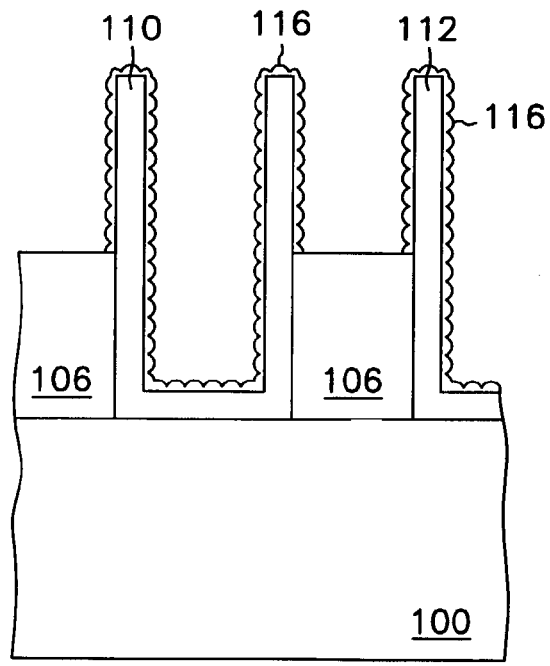

It is desired to form a selective silicon based film 116, as shown in FIG. 1B, on the containers 110 and 112 without forming any conductive path on the insulator 106 between the containers. To do this, a chlorine containing gas mixture is added to dilute hydride gases normally used during seeding of the containers. This results in a thin polysilicon film being formed on exposed container surfaces, while such a film is inhibited from forming on insulator 106.

In one embodiment, the hydride gas comprises silane, disilane or trisilane flowed at least 1 sccm, but preferably within a range of 5 to 20 sccm, with a nitrogen ambient flowed at a selected rate depending on desired dilution such as 500 to 1000 sccm. Other inert ambient gases such as argon may also be used. Chlorine is then provided following stabilization of the hydride flow and the temperature of the system is raised in steps to approximately 500–800 degrees Celcius, which is low enough to prevent active formation of HSG. Since chlorine acts as an etchant on the insulative layer 106, it helps prevent the formation of a silicon film on the insulative layer 106.

In a further embodiment, a carrier gas such as $H_2$ or $N_2$ is used, and HCl is flowed following stabilization of the hydride flow during seeding of the container structures.

Pressures in which the seeding is conducted range from $1.0 \times 10^{-4}$ to approximately atmospheric pressure, using a 10% carrier gas of $H_2$ or $N_2$ with disilane flows ranging from 5 sccm to 20 sccm at a temperature of at least approximately 550 to 660 degrees Celsius or within a range of about 500–800 degrees Celsius for a variable time as desired. In one embodiment, the time is about 70 seconds.

Following the seeding step, an anneal is performed to create HSG on the container structures. The anneal is commonly performed at a temperature of at least approximately 500 degrees Celsius or within a range of 600 to 700 degrees Celsius in the same pressure ranges for about 40 seconds to form HSG. The time period may range from 1 to 60 seconds or more. Experimental results following the above process variations have shown that use of H2 as a diluting/carrier gas results in better selectivity as reflected in increased resistance exhibited between adjacent containers over prior methods.

Figures 2A, 2B:
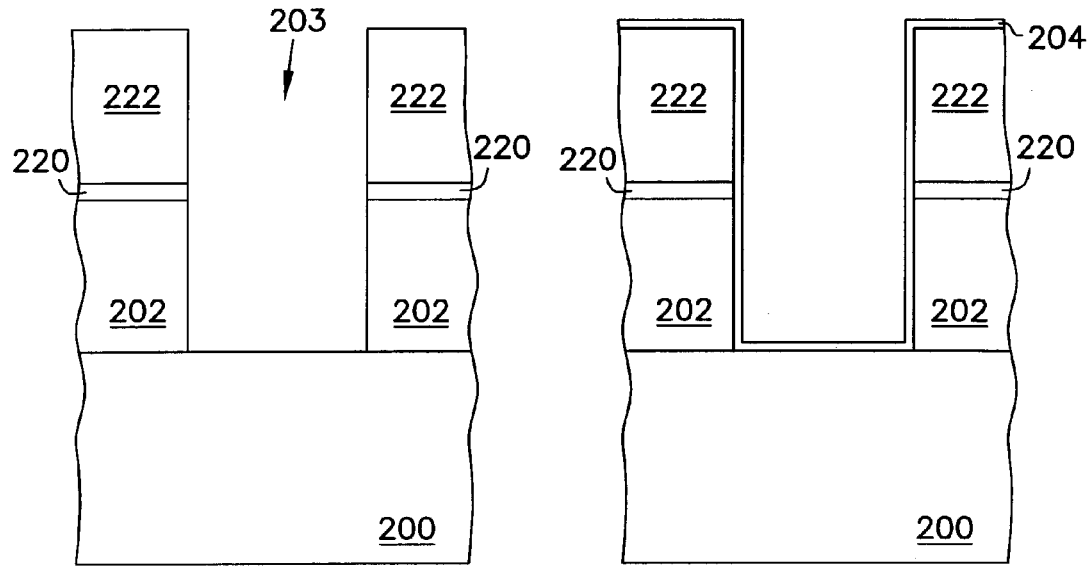
FIGS. 2A, 2B, 2C, 2D, 2E, 2F, 2G, and 2H are cross-sectional representations illustrating steps of forming selective HSG on a polysilicon structure in accordance with the present invention.

In a further embodiment as represented in FIGS. 2A-H, formation of a stacked capacitor bottom electrode is described. The steps used to form the electrode include the use of chlorine in the seeding step prior to formation of HSG to increase the capacitance. In FIG. 2A a multi layer insulative sidewall comprising a support layer 202 of undoped oxide, BSG, PSG or TEOS which is formed on a substrate 200 in a known manner. The substrate 200 also contains other circuitry commonly used to form a dynamic random access memory (DRAM). The support layer 202 is followed by formation of an etch stop layer 220 comprising nitride. The etch stop layer 220 is further followed by formation of a BPSG layer 222, completing the multi layer sidewall. An opening 203 is then etched in the sidewall. The opening may extend all the way to the substrate, and may expose active areas formed thereon, or may also be formed within the sidewall layer above the substrate, perhaps contacting circuitry formed in the sidewall layer. Alternatively, a plug is formed in the bottom of the container to contact desired active areas.

Figures 2C, 2D:
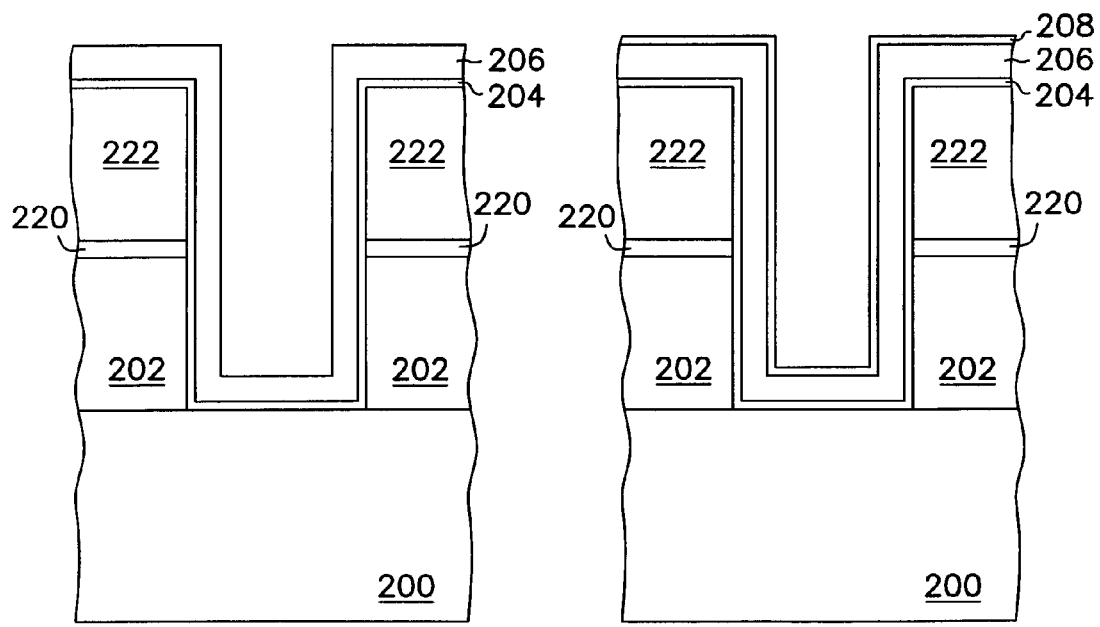

Following formation of the opening 203, a first layer of undoped or substantially undoped amorphous polysilicon 204 having a thickness approximately between 40 and 500 angstroms is formed over the insulative layer, as shown in FIG. 2B. Typically, the undoped amorphous polysilicon 204 is formed at temperatures between approximately 450 and 580 degrees Celsius. Because it is formed at a low pressure of 1 atmosphere or below, such as within a range of approximately $10^{-3}$ to $10^{-1}$ Torr in hydrogen or other inert ambient having a base pressure of approximately $10^{-8}$ Torr, but within a range of approximately $10^{-8}$ to $10^{-1}$ Torr, the undoped amorphous polysilicon 204 is formed with a relatively low surface roughness. Subsequently, a heavily doped n+ amorphous silicon layer 206 having a thickness between 100 and 1000 angstroms is deposited on the first undoped layer 204, as shown in FIG. 2C. The layer 206 may be n or p doped. Common dopants for layer 206 comprise n or p-type dopants such as arsenic, phosphorous or boron. The doped layer 206 is formed at a temperature between approximately 450 and 600 degrees Celsius with a doping level between $5 \times 10^{18}$ and $5 \times 10^{22}$ cm$^{-3}$ at a pressure range of approximately $10^{-8}$ to $10^{-1}$ Torr.

The heavily doped layer 206 is followed by a second layer of undoped or substantially undoped amorphous polysilicon 208, which is formed on the doped amorphous silicon layer 206 under similar conditions and using the same or similar parameters as used when forming first undoped layer 204, as shown in FIG. 2D. The substantially undoped layers 204, 208 provide good nucleation sites for subsequent seeding used to form hemispherical grained polysilicon (HSG). The layers are substantially amorphous to aid in the formation of HSG, but need not be completely amorphous. The silicon layers 204, 206, and 208 are typically formed with silane or disilane. However, organo- and other hydride precursors can be used instead. Processing is performed in a hydrogen atmosphere to prevent an undesirable insulating layer, of oxide for example, from forming on or between the silicon layers during formation. The silicon layers are formed in a single wafer tool so that ambients can be changed quickly, which helps prevent oxidation between layers. Batch and batch cluster tools may also be used.

Figures 2E, 2F:
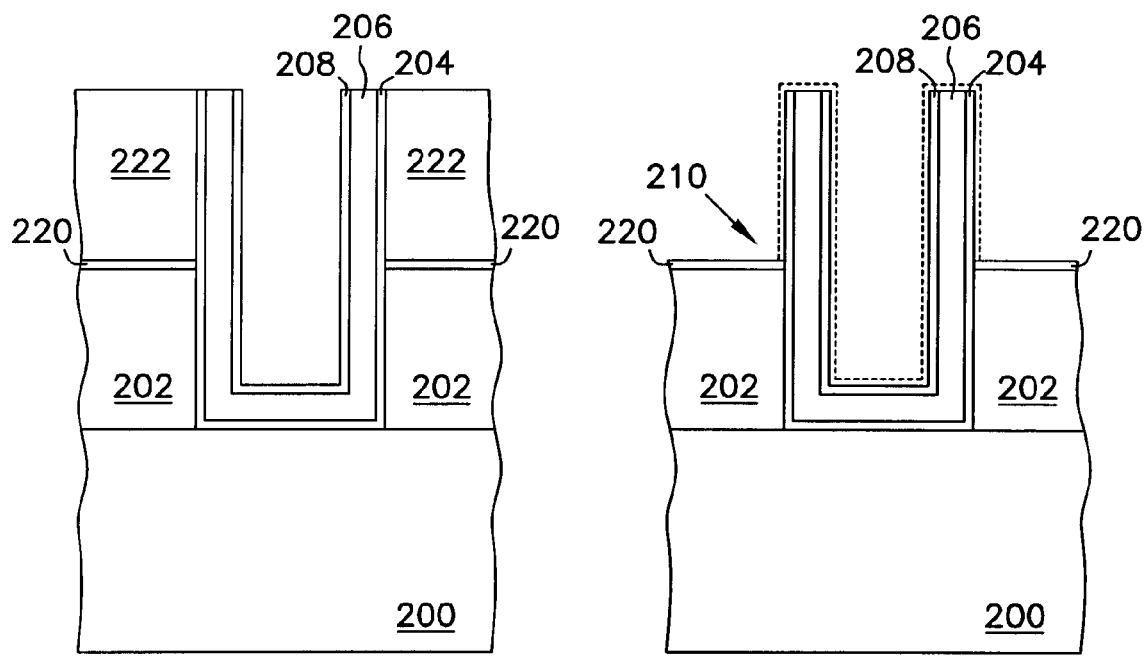

Next, the wafer is planarized, such as by chemical mechanical planarization for example, to remove undesired lateral portions of the deposited silicon layers 204, 206, 208, as shown in FIG. 2E. Subsequently, BPSG layer 222 is removed as by etching to expose the exterior sidewalls of the bottom electrode in the shape of a container 210 in FIG. 2F. Layer 222 should have good etch selectivity with respect to etch stop 220, which is formed of nitride or other desired dielectric material that functions as an etch stop. Optionally, layer 222 has sufficient etch selectivity with respect to support layer 202 such that no separate etch stop layer is required. By modifying the thicknesses of these sidewall layers 202, 220 and 222, the amount of support provided to the resulting container can be varied as desired. Such a multi layer insulator may also be used to provide support to other capacitor containers formed in different manners.

The sides of the resulting container comprise pillars of doped silicon 206 surrounded by layers of "paint" comprising undoped silicon layers 204 and 208. Because the first amorphous silicon layer 204 has a relatively low surface roughness, most of the insulator layer 202 is removed. Thus, capacitors can be separated by a pitch of less than two tenths of the diameter of a container, such as 0.18 microns in current high density DRAMs.

Figures 2G, 2H:
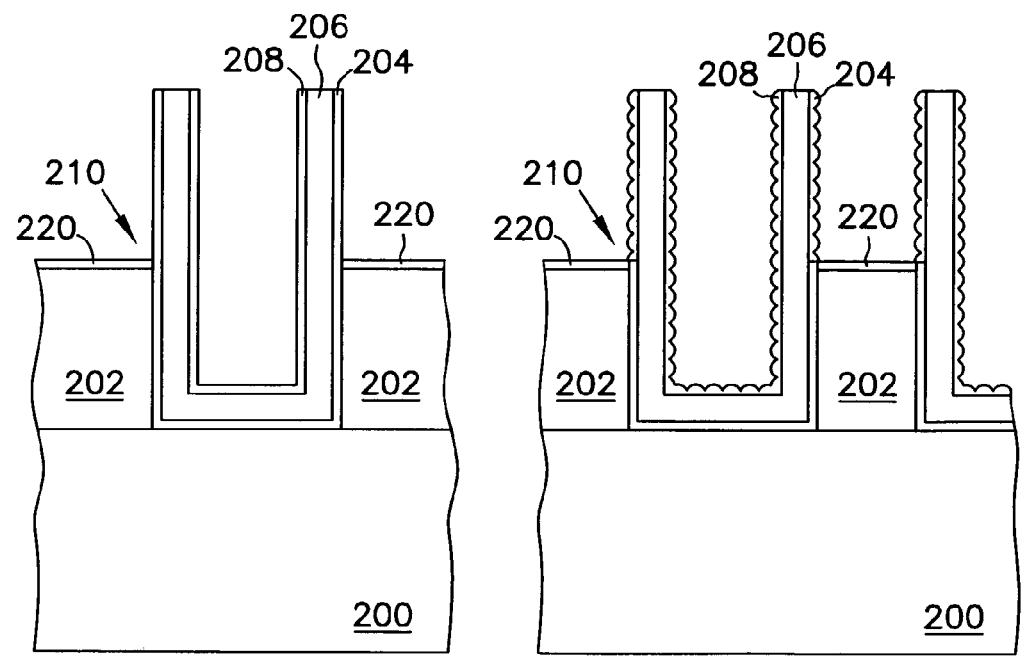

At this point, a native oxide remains on the exterior exposed pillars as indicated by the broken line in FIG. 2F. The native oxide is selectively removed by lithography and wet or dry etching, such as with a combination of hydrofluoric acid, chlorine, and ultraviolet light as represented in FIG. 2G. Removal of the native oxide promotes enhanced HSG formation in the next step.

To selectively create HSG, the thin, smooth, amorphous silicon layers 204 and 208 are then seeded with a chemical species where they are exposed, such as germanium, silicon, or titanium, in combination with a hydride gas such as silane, disilane or trisilane at different partial pressures. In one embodiment, germanium seeding is provided at approximately greater than 1%, in an approximate range of 1 to 30%. The seeding is performed in a rapid thermal or low pressure chemical vapor deposition tool. The silane or disilane is added at a rate as previously described. The species are added at a pressure of approximately one atmosphere or less.

Chlorine is then provided following stabilization of the hydride flow and the temperature of the system is raised in steps to approximately 500–800 degrees Celsius, which is low enough to prevent active formation of HSG. Since chlorine acts as an etchant on the insulative layer 202, it helps prevent the formation of a silicon film on the insulative layer 202 by removing any residual silicon that forms. It further may have a roughening effect by inhibiting formation of extra silicon between grains of the HSG that forms in further steps.

In a further embodiment, a carrier gas such as $H_2$ or $N_2$ is used, and HCl is flowed following stabilization of the hydride flow to seed the container structures.

Pressures in which the seeding is conducted range from $1.0 \times 10^{-4}$ to 1 atmosphere, using a 10% carrier gas of $H_2$ or $N_2$ with disilane flows ranging from 5% to 20% at a temperature of about 500–800 degrees Celsius for a variable period of time, such as about 70 seconds.

Subsequently, the DRAM 200 is annealed to convert the undoped layers 204, 208 into HSG as indicated in FIG. 2H. The anneal is performed at a temperature in the range of approximately 450 to 700 degrees C., sufficient to cause at least partial migration of dopants to undoped layers. The resulting structure comprises pillars of doped silicon surrounded by layers of HSG having dopants which have migrated from the doped pillars. In one embodiment, layer 206 is n doped, and may also be seeded with germanium.

It is to be understood that the above description is intended to be illustrative, and not restrictive. Many other embodiments will be apparent to those of skill in the art upon reviewing the above description. For example, the shape of the storage electrode may be a plain cubic structure, a cylindrical structure, a fin-type structure, or a stacked trench type structure. Furthermore, the present invention describes the formation of a three-dimensional container for a bottom electrode of a stacked capacitor. However, other electrode structures, including a ministack, and honeycomb, known to those skilled in the art, can be formed in a similar manner. Still further, the method of selective deposition may be used in memory devices other than DRAMs and for selective deposition on other silicon structures structures, such as conductors while preventing formation of polysilicon on oxide surfaces. It may be used to produce capacitors used in general circuitry, and not for storage of data. The scope of the invention should, therefore, be determined with reference to the appended claims, along with the full scope of equivalents to which such claims are entitled.

What is claimed is:

1. A method for forming an integrated circuit, comprising:
    forming at least one transistor within a substrate;
    forming at least one capacitor in an insulative layer supported by the substrate, comprising:
        forming a first electrode comprising:
            removing a first portion of the insulator layer to form an opening;
            forming a first layer of undoped silicon in the opening, the first layer depositing on a bottom interface and a sidewall interface in the opening;
            forming a layer of doped silicon on the first layer of undoped silicon;
            forming a second layer of undoped silicon on the doped layer of silicon;
            removing selected portions of the insulative layer to expose at least a portion of the sidewall interface of the first layer of undoped silicon;

seeding the first and second undoped silicon layers using an environment that includes a hydride gas and a seeding species to form a seeded silicon coating;

preventing silicon buildup on the insulative layer during seeding by adding chlorine to the environment after stabilization of the hydride flow;

annealing the seeded silicon layers to convert the first and second undoped silicon layers to HSG;

forming a second electrode separated from the first electrode by a dielectric region; and coupling at least one capacitor to at least one transistor.

2. The method of claim 1 where the seeding species is selected from the group consisting of germanium, silicon, and titanium.

3. The method of claim 1 where the hydride gas is selected from the group consisting of silane, disilane, and trisilane.

4. A method for forming an integrated circuit, comprising:
forming at least one transistor within a substrate;
forming at least one capacitor in an insulative layer supported by the substrate, comprising:
forming a first electrode comprising:
providing an exposed silicon surface adjacent to an exposed insulative surface;
seeding the exposed silicon surface with an environment that includes a hydride gas and a seeding species to form a seeded silicon coating;
preventing silicon buildup on the insulative surface during seeding by adding chlorine to the environment;
annealing the seeded silicon surface to convert the seeded silicon surface to HSG;
forming a second electrode separated from the first electrode by a dielectric region; and
coupling at least one capacitor to at least one transistor.

5. The method of claim 4 where the seeding species is selected from the group consisting of germanium, silicon, and titanium.

6. The method of claim 4 where the hydride gas is selected from the group consisting of silane, disilane, and trisilane.

7. A method for forming a memory device comprising:
forming an access transistor;
forming a storage capacitor coupled to the access transistor, including:
forming a first electrode, including:
providing an exposed silicon surface adjacent to an exposed insulative surface;
seeding the exposed silicon surface with an environment that includes a hydride gas and a germanium seeding species to form a seeded silicon coating;
preventing silicon buildup on the insulative surface during seeding by adding chlorine to the environment;
annealing the seeded silicon surface to convert the seeded silicon surface to HSG; and
forming a second electrode separated from the first electrode by a dielectric region.

8. The method of claim 7, wherein the hydride gas is selected from the group consisting of silane, disilane, and trisilane.

9. The method of claim 7, wherein seeding is performed in the presence of an $H_2$ carrier gas.

10. The method of claim 7, wherein forming a memory device includes forming a DRAM memory device.

11. A method for forming a memory device comprising:
forming an access transistor;
forming a storage capacitor coupled to the access transistor, including:
forming a first electrode, including:
providing an exposed silicon surface adjacent to an exposed insulative surface;
seeding the exposed silicon surface with an environment that includes a hydride gas and a germanium seeding species to form a seeded silicon coating;
preventing silicon buildup on the insulative surface during seeding by adding HCl to the environment;
annealing the seeded silicon surface to convert the seeded silicon surface to HSG; and
forming a second electrode separated from the first electrode by a dielectric region.

12. The method of claim 11, wherein the hydride gas is selected from the group consisting of silane, disilane, and trisilane.

13. The method of claim 11 where the seeding species is selected from the group consisting of germanium, silicon, and titanium.

14. A method for forming a memory device comprising:
forming an access transistor;
forming a storage capacitor coupled to the access transistor, including:
forming a first electrode, including:
providing an exposed silicon surface adjacent to an exposed insulative surface;
seeding the exposed silicon surface with an environment that includes a hydride gas and a germanium seeding species to form a seeded silicon coating;
preventing silicon buildup on the insulative surface during seeding by adding $Cl_2$ to the environment;
annealing the seeded silicon surface to convert the seeded silicon surface to HSG; and
forming a second electrode separated from the first electrode by a dielectric region.

15. The method of claim 14, wherein the hydride gas is selected from the group consisting of silane, disilane, and trisilane.

16. The method of claim 14, wherein seeding is performed in the presence of an $H_2$ carrier gas.

17. The method of claim 14, wherein seeding is performed in the presence of an $N_2$ carrier gas.

18. A method for forming an integrated circuit, comprising:
forming an access transistor;
forming a storage capacitor coupled to the access transistor, including:
forming a first electrode, including:
providing an exposed silicon surface adjacent to an exposed insulative surface;
seeding the exposed silicon surface with an environment that includes a hydride gas and a germanium seeding species to form a seeded silicon coating;
preventing silicon buildup on the insulative surface during seeding by adding chlorine to the environment;
annealing the seeded silicon surface to convert the seeded silicon surface to HSG; and
forming a second electrode separated from the first electrode by a dielectric region.

19. The method of claim 18, wherein the hydride gas is selected from the group consisting of silane, disilane, and trisilane.

20. The method of claim 18, wherein seeding is performed in the presence of an $H_2$ carrier gas.

21. The method of claim 18, wherein forming a memory device includes forming a DRAM memory device.

22. A method for forming an integrated circuit, comprising:
   forming an access transistor;
   forming a storage capacitor coupled to the access transistor, including:
      forming a first electrode, including:
         providing an exposed silicon surface adjacent to an exposed insulative surface;
         seeding the exposed silicon surface with an environment that includes a hydride gas and a germanium seeding species to form a seeded silicon coating;
         preventing silicon buildup on the insulative surface during seeding by adding HCl to the environment;
         annealing the seeded silicon surface to convert the seeded silicon surface to HSG; and
      forming a second electrode separated from the first electrode by a dielectric region.

23. The method of claim 22, wherein the hydride gas is selected from the group consisting of silane, disilane, and trisilane.

24. The method of claim 22 where the seeding species is selected from the group consisting of germanium, silicon, and titanium.

25. A method for forming an integrated circuit, comprising:
   forming an access transistor;
   forming a storage capacitor coupled to the access transistor, including:
      forming a first electrode, including:
         providing an exposed silicon surface adjacent to an exposed insulative surface;
         seeding the exposed silicon surface with an environment that includes a hydride gas and a germanium seeding species to form a seeded silicon coating;
         preventing silicon buildup on the insulative surface during seeding by adding $Cl_2$ to the environment;
         annealing the seeded silicon surface to convert the seeded silicon surface to HSG; and
      forming a second electrode separated from the first electrode by a dielectric region.

26. The method of claim 25, wherein the hydride gas is selected from the group consisting of silane, disilane, and trisilane.

27. The method of claim 25, wherein seeding is performed in the presence of an $H_2$ carrier gas.

28. The method of claim 25, wherein seeding is performed in the presence of an $N_2$ carrier gas.

* * * * *

UNITED STATES PATENT AND TRADEMARK OFFICE
CERTIFICATE OF CORRECTION

PATENT NO. : 7,229,890 B2
APPLICATION NO. : 10/368069
DATED : June 12, 2007
INVENTOR(S) : Thakur et al.

It is certified that error appears in the above-identified patent and that said Letters Patent is hereby corrected as shown below:

On the Title page, in field (57), "Abstract", in column 2, line 6, delete "hemishperical" and insert -- hemispherical --, therefor.

In column 1, line 18, delete "depostion" and insert -- deposition --, therefor.

In column 4, line 3, delete "Celcius," and insert -- Celsius, --, therefor.

In column 4, line 26, delete "H2" and insert -- $H_2$ --, therefor.

In column 6, line 43, after "silicon structures" delete "structures".

Signed and Sealed this

Eleventh Day of September, 2007

JON W. DUDAS
*Director of the United States Patent and Trademark Office*